(12) United States Patent
Abedifard et al.

(10) Patent No.: US 8,861,260 B2
(45) Date of Patent: Oct. 14, 2014

(54) MULTI-PORT MAGNETIC RANDOM ACCESS MEMORY (MRAM)

(71) Applicant: Avalanche Technology, Inc., Fremont, CA (US)

(72) Inventors: Ebrahim Abedifard, San Jose, CA (US); Parviz Keshtbod, Los Altos Hills, CA (US)

(73) Assignee: Avalanche Technology, Inc., Fremont, CA (US)

(*) Notice: Subject to any disclaimer, the term of this patent is extended or adjusted under 35 U.S.C. 154(b) by 0 days.

(21) Appl. No.: 14/204,274

(22) Filed: Mar. 11, 2014

(65) Prior Publication Data

US 2014/0192590 A1   Jul. 10, 2014

Related U.S. Application Data

(63) Continuation of application No. 13/585,774, filed on Aug. 14, 2012, now Pat. No. 8,670,264.

(51) Int. Cl.
   *G11C 5/14* (2006.01)
   *G11C 11/16* (2006.01)
(52) U.S. Cl.
   CPC ........ *G11C 11/1673* (2013.01); *G11C 11/1675* (2013.01)
   USPC .......................................... 365/148; 365/158

(58) Field of Classification Search
   USPC .................................................. 365/148, 158
   See application file for complete search history.

(56) References Cited

U.S. PATENT DOCUMENTS

| | | | | |
|---|---|---|---|---|
| 2003/0223283 A1* | 12/2003 | Kunikiyo | ...................... | 365/200 |
| 2004/0061180 A1* | 4/2004 | Hsu et al. | ...................... | 257/368 |
| 2004/0114428 A1* | 6/2004 | Morikawa | ...................... | 365/158 |
| 2010/0210095 A1* | 8/2010 | Jung et al. | ...................... | 438/525 |
| 2011/0215382 A1* | 9/2011 | Asao et al. | ...................... | 257/252 |
| 2011/0228595 A1* | 9/2011 | Rao et al. | ...................... | 365/158 |
| 2011/0299330 A1* | 12/2011 | Ong | ............................. | 365/171 |
| 2012/0020140 A1* | 1/2012 | Chen | ............................. | 365/148 |
| 2013/0121056 A1* | 5/2013 | Liu et al. | ...................... | 365/148 |

* cited by examiner

*Primary Examiner* — Michael Tran
(74) *Attorney, Agent, or Firm* — Maryam Imam; IPxLAW Group LLP

(57) ABSTRACT

A memory array is organized into rows and columns of resistive elements and is disclosed to include a resistive element to be read or to be written thereto. Further, a first access transistor is coupled to the resistive element and to a first source line and a second access transistor is coupled to the resistive element and to a second source line, the resistive element being coupled at one end to the first and second access transistors and at an opposite end to a bit line. The memory array further has other resistive elements that are each coupled to the bit line. The resistive element is written to while one or more of the other resistive elements are being read.

10 Claims, 3 Drawing Sheets

MULTI-PORT MAGNETIC RANDOM ACCESS MEMORY (MRAM)

CROSS-REFERENCE TO RELATED APPLICATIONS

The application is a continuation application of U.S. patent application Ser. No. 13/585,774, filed on Aug. 14, 2012, by Ebrahim Abedifard, and entitled "Multi-Port Magnetic Random Access Memory (MRAM)".

BACKGROUND OF THE INVENTION

1. Field of the Invention

The invention relates to a magnetic random access memory (MRAM), and, more particularly, to increasing the performance of read and write operations to MRAM cells of a memory array.

2. Description of the Prior Art

Magnetic random access memory (MRAM) shows significant promise in the world of memory and other storage, such as to replace solid state. It is expected that MRAM will replace conventional non-volatile memory and solid state storage and perhaps even other types of storage in the near years ahead. However, great strides are to first be made before wider adoption and popularity of MRAMs, as this type of memory is still in its infancy.

Among other challenges, memory systems utilizing MRAMs face performance issues during read and write operations. Generally, MRAM, such as magnetic tunnel junction (MTJ) is paired with an access transistor that directs the reading from and writing to the MTJ. The access transistor is typically coupled to a word line of the memory system or array and a bit line and a sense line are coupled to the MTJs of the array for accessing and reading and writing thereof, under the direction of access transistors. However, only one MTJ of a column of MTJs that are all connected to the same bit line can be read and/or written at any given time. When any other MTJ of the same column is to be accessed for reading and writing operations, the MTJ that is being programmed or read must be released prior to programming or reading of any other MTJ that is coupled to a common bit line. In some memory applications it would be beneficial to read and write the same cell via different ports. There could be two or more ports that the memory can be read or written to. As an example one such memory can be read by the CPU while it is being written into by another device. As is appreciated, this would require extra rows and columns in order to access the same cell from different ports.

Therefore, in light of the foregoing, what is needed is a memory array, made of, at least in part, MRAMs with read and write capability from different ports.

SUMMARY OF THE INVENTION

To overcome the limitations in the prior art described above, and to overcome other limitations that will become apparent upon reading and understanding the present specification, the invention discloses a method and a corresponding structure for a magnetic memory system including magnetic tunnel junctions (MTJs) and structures and methods for programming and reading the same.

Briefly, a memory array is organized into rows and columns of resistive elements and is disclosed to include a resistive element to be read or to be written thereto. Further, a first access transistor is coupled to the resistive element and to a first source line and a second access transistor is coupled to the resistive element and to a second source line, the resistive element being coupled at one end to the first and second access transistors and at an opposite end to a bit line. The memory array further has other resistive elements that are each coupled to the bit line. The resistive element can be written to while one or more of the other resistive elements are being read.

These and other objects and advantages of the present invention will no doubt become apparent to those skilled in the art after having read the following detailed description of the various embodiments illustrated in the several figures of the drawing.

IN THE DRAWINGS

DETAILED DESCRIPTION OF VARIOUS EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

In accordance with an embodiment of the invention, a memory array is organized into rows and columns of resistive elements and is disclosed to include a resistive element to be read or to be written thereto. Further, a first access transistor is coupled to the resistive element and to a first source line and a second access transistor is coupled to the resistive element and to a second source line, the resistive element being coupled at one end to the first and second access transistors and at an opposite end to a bit line. The memory array further has other resistive elements that are each coupled to the bit line. The resistive element is written to while one or more of the other resistive elements are being read.

Figure 1:
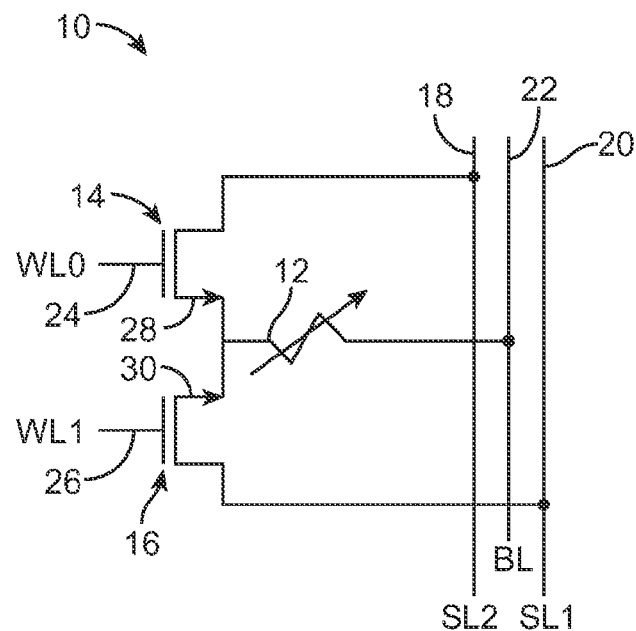
FIG. 1 shows a portion of a memory array 10 is shown in accordance with an embodiment of the invention.

Referring now to FIG. 1, a portion of a memory array 10 is shown in accordance with an embodiment of the invention. The array 10 is shown to include a resistive element 12, an access transistor 14, and an access transistor 16. Each of the access transistors 14 and 16, as is well known to those in the art, have a source, a drain, and a gate. Further, a bit line 22 (or "BL") is shown coupled to one end (or "port") of the resistive element 12 and a source line 20 (also referred to herein as "SL1") is shown coupled to the source of the transistor 16. A source line 18 (also referred to herein as "SL2") is further shown coupled to the source of the transistor 14. Another end (or "port") of the resistive element 12, which is shown opposite to the end thereof that is coupled to the bit line, is shown coupled to the drain of each of the transistors 14 and 16. Word line 24 (also referred to herein as "WL0") is shown coupled to the gate of the access transistor 14 and the word line 26 (also known as "WL1") is shown coupled to the gate of the access transistor 16.

Each of the transistors 14 and 16 is a n-channel transistor though p-channel transistors are contemplated in which some changes, known to those in the art, to the configuration of the array 10 result.

In some embodiments, the resistive element 12 is a magnetic tunnel junction memory (MTJ), well know to those in the art. Some such MRAMs are made of magnetic tunnel junctions (MTJs) such as spin transfer torque magnetic random access memory (STTMRAM). Other types of resistive elements, while not listed in the interest of brevity, are nevertheless anticipated.

In operation, the word line 24 is activated in conjunction with the activation of the source line 18 to access the resistive element 12 for programming and/or reading but at the same time, activation of the word line 26 in conjunction with activation of the source line 20 can be effectuated to allow accessing of the resistive element 12 by another device.

According, the resistive element 12 is configured to be dual port due to the use of each of the source lines 18 and 20, in addition to the distinct word lines 24 and 26, allowing dual access of the resistive element 12 for reading and writing. As such and advantageously, the resistive element 12 can be accessed with two devices at the same time. For example, data that is stored in the resistive element 12 can be read by a processor while another data is being written in another location, substantially simultaneously, of an array made of resistive elements including the resistive element 12. In the dual port configuration of FIG. 1, a pair of word lines, a pair of bit lines and a pair of sense amplifiers are required.

A few exemplary scenarios of reading/writing operations to the element 12 will now be discussed. When performing reading of the element 12 through a single port only, such as the port coupled to the word line 24, the bit line 22 is fixed to a specific voltage, such as Vs, the word line 24 is driven high, the word line 26 is driven low and the source line 18 is driven by a sense amplifier, which is shown and explained relative to subsequent figures. When reading the element 12 through dual ports, i.e. by two devices simultaneously, the following occurs. The voltage at bit line 22 is fixed at Vs, the word line 24 is driven high, the word line 26 is driven high, the source line 18 is sensed by a sense amplifier and the source line 20 is sensed by a separate sense amplifier, as will be shown and discussed shortly. During a write operation to the element 12, assuming the word line 24 is used to write or program the element 12, the voltage at the bit line 22 is set to 0.5 volts, the word line 24 is set high, the word line 26 is set low and if programming is from an anti-parallel to a parallel state, such as in the case where the element 12 is a MTJ, the sense line 18 is set to zero volts and for the case of parallel to anti-parallel programming, the sense line 18 is set to Vdd. "high".

When writing to the element 12 through the word line 26, the voltage at the bit line 22 is set to Vdd, the voltage of the word line 24 is set low, the voltage at the word line 26 is set high, and if programming is from an anti-parallel to a parallel state, such as in the case where the element 12 is a MTJ, the sense line 20 is set to zero volts and for the case of parallel to anti-parallel programming, the sense line 20 is set to Vdd.

In the case where writing to the element 12 is done sequentially and using the word line 24, followed by reading through the word line 26, the voltage at the bit line 22 is set to 0.5 volts or Vdd, the voltage of the word line 24 is set to a very high value (as an example 1.5V), the voltage at the word line 26 is set low, and in the case where the element 12 is a MTJ and being programmed from an anti-parallel state to a parallel state, the voltage of the sense line 18 is set to zero volts and for the case where the state is being programmed from parallel to anti-parallel, the voltage of the sense line 18 is set to Vdd.

During reading, the voltage at the bit line 22 is set to Vx, the voltage of the word line 24 is set to high and the voltage of the source line 20 is sensed by a sense amplifier.

Figure 2:
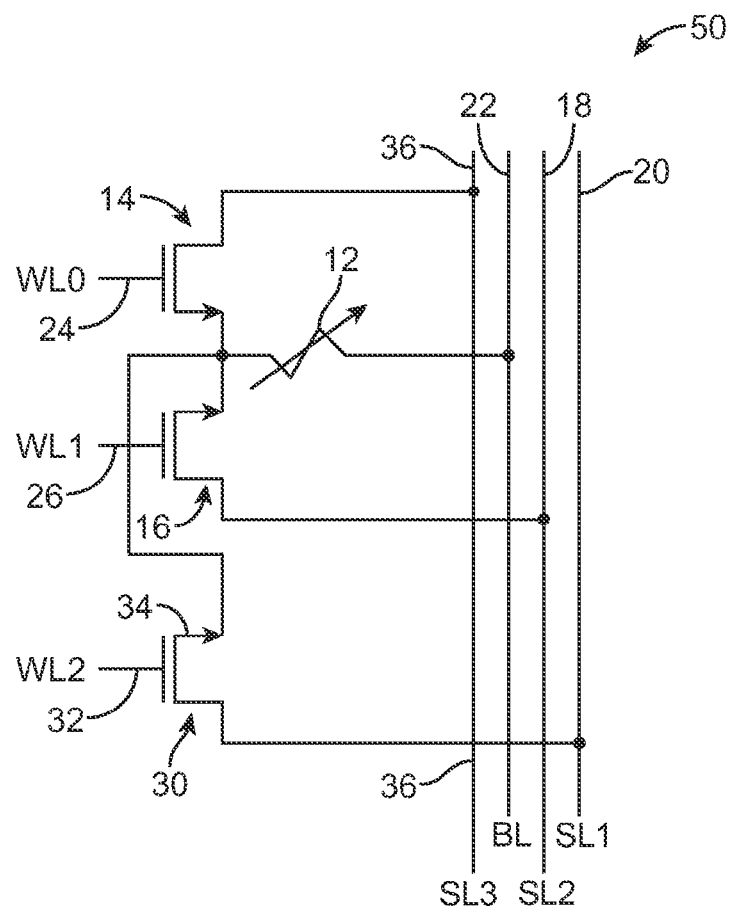
FIG. 2 shows a portion of a memory array 50 is shown in accordance with another embodiment of the invention.

FIG. 2 shows a portion of a memory array 50 is shown in accordance with another embodiment of the invention. The array 50 is shown to include the resistive element 12, the access transistor 14, and the access transistor 16 but because the configuration of the array 50 results in the resistive element 12 being a triple port, another access transistor 30 is shown coupled to the port of the resistive element 12 that is coupled to the transistors 14 and 16. The transistor 30 is also a n-channel transistor with the understanding that as in the case of the transistors 14 and 16, the transistor 30 may be an p-channel transistor. The transistor 30 is shown to have a gate 32 that is coupled to a word line 32 (also referred to herein as "WL2") and it further has a source coupled to the source line 20 and its drain 34 is shown coupled to the resistive element 12 and the source of each of the transistors 14 and 16. The resistive element 12 is shown coupled to the transistors 14 and 16 and to the bit line 22, and the source lines 18 and 20 in the same manner as that shown and discussed relative to the embodiment of FIG. 1.

Due to the addition of the transistor 30 and the word line 32 and the sense line 36, relative to the embodiment of FIG. 1, the resistive element 12 is triple ported where up to three different devices can access it simultaneously for various operations.

Figure 3:
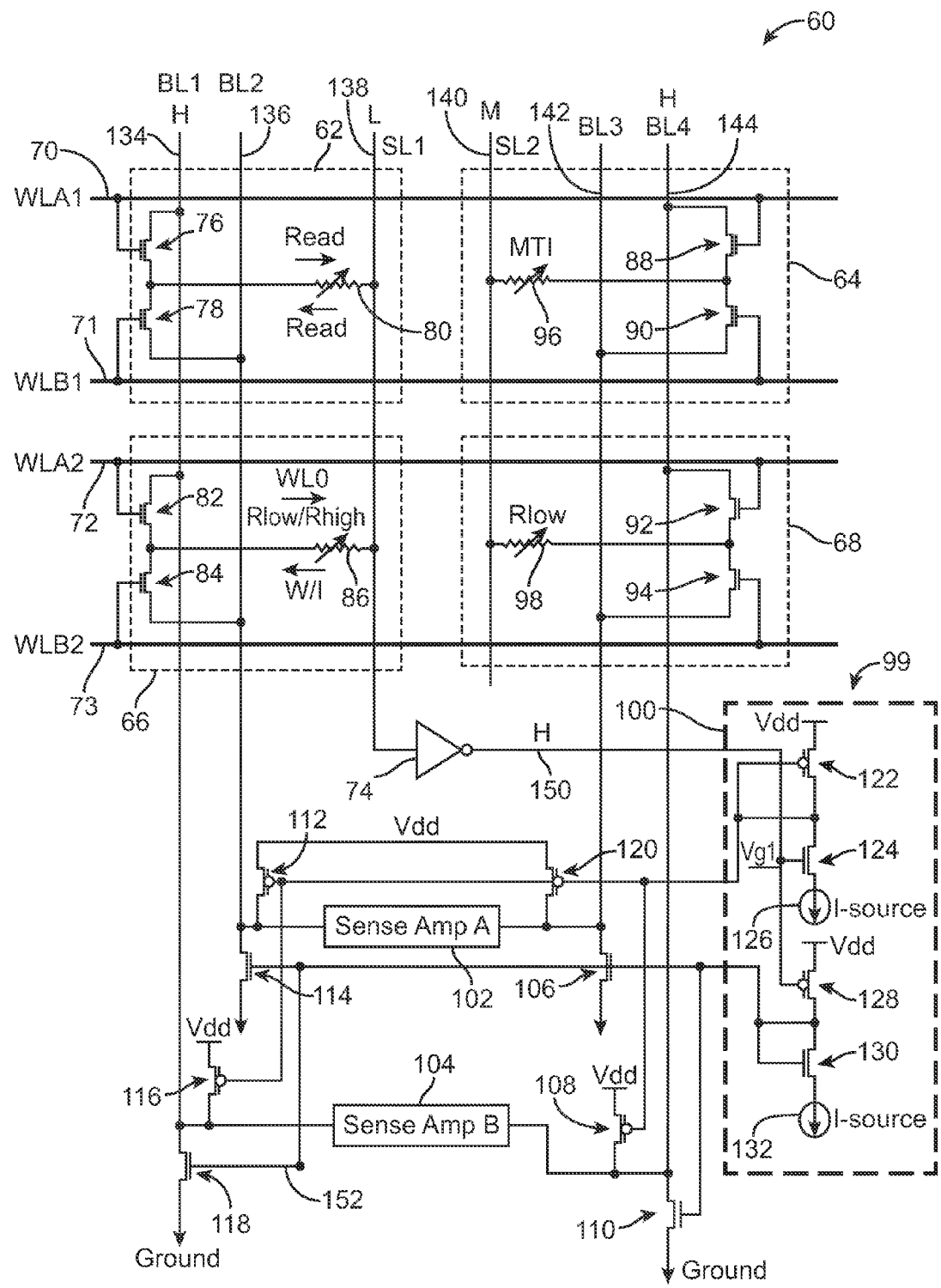
FIG. 3 shows a memory array 60, organized in rows and columns of memory cells, in accordance with another embodiment of the invention.

FIG. 3 shows a memory array 60, organized in rows and columns of memory cells, in accordance with another embodiment of the invention. In FIG. 3, the memory array 60 is shown to have four memory cells 62-68, and memory circuit 99. While four memory cells are shown in FIG. 3, it is understood that the memory array 60 can have any number of memory cells and it commonly has many more than shown. Each of the memory cells 62-68 is analogous to the resistive element 12, and the transistors 14 and 16, collectively, in that it is a dual port memory cell including a resistive element and two access transistors. For example, the cell 62 is shown to include the resistive element 80 and an access transistor 76 and an access transistor 78 with these transistors coupled to the element 80 in an analogous manner as the configuration of the embodiment of FIG. 1 except that in the case of the embodiment of FIG. 3, bit line ("BL1") 134 and bit line ("BL2") 136 are shown coupled to the transistors instead of source lines being coupled to these transistors. Indeed, the use of bit lines and source lines in this manner is an interchangeable one. Accordingly, in FIG. 1, the source lines 18 and 20 may be bit lines instead in which case the bit line 22 would be a source line. Accordingly, the resistive element 80, which similar to the element 12 can be a MRAM or other types of resistive element, is shown coupled to the source line 138, in FIG. 3.

Each of the gates of each access transistor 76, 78, 82, 84, 88, 90, 92, and 94 is shown to be coupled to a word line. For example, the transistor 76 is shown coupled, through its gate, to the word line 70 (also referred to herein as "WLA1") and the gate of the transistor 78 is shown coupled to the word line 71 ("WLB1"). The gate of the transistor 90 is shown coupled to the word line 71 and the gate of the transistor 88 is shown coupled to the word line 70. Similarly, the gate of the transistor 82 is shown coupled to the word line 72 and the gate of the transistor 84 is shown coupled to the word line 73 and the gate of the transistor 94 is shown coupled to the word line 73 and the gate of the transistor 92 is shown coupled to the word line 72.

The transistors 76 and 78 allow for a dual port access of the element 80, as do the transistors 88 and 90 for the element 96 and the transistors 82 and 84 for the element 86 and the transistors 92 and 94 for the element 98. The transistors 88 and 90 are shown coupled to the bit line 144 ("BL4") and the bit line 142 ("BL3"), respectively. Similarly, the transistors 92 and 94 are shown coupled to the bit line 144 and the bit line 142, respectively.

The circuit 99 is an exemplary embodiment of a memory circuit and many others with varying designs and configurations are contemplated. The circuit 99 is shown to include a driver 100, an inverter 74, a sense amplifier 102 (also referred to herein as "sense amp A"), a sense amplifier 104, transistors 112, 114, 118, 116, 120, 106, 108, and 110, which all, with the aid of the word lines 70-73, cause accessing of the resistive elements 80, 86, 96, and 98 for reading and writing operations. While the word lines 70-73 are driven by row decoders, well known in the industry, the bit lines and source lines of the array 60 are driven by the circuit 99, as is further discussed below relative to read and write operations.

In the circuit 99, the driver 100 is shown to include the transistors 122, 124, 128, and 130, and the current sources 126 and 132. The transistors 122 and 128 are shown to be p-channel transistors while the transistors 130 and 124 are shown to be n-channel transistors. It is understood that these transistors may be of opposite types or even other types, in other embodiments.

Similarly, the transistors 112, 120, 116, and 108 are shown to be p-channel transistors and the transistors 118, 110, 114, and 106 are shown to be n-channel transistors with the understanding that other types of transistors may be used. The sense amplifier 102 is shown coupled to the transistors 120, 106, 114, and 112 and the sense amplifier 104 is shown coupled to the transistors 108, 110, 116, and 118.

The inverter 74 is shown coupled to one end (or "port") of each of the elements 80 and 86 and inverts the state thereof and passes on, as its output 150, the inverted state of these resistive elements to the transistors 124 and 128 of the driver 100. The gate of the transistor 120 is shown coupled to the drain of the transistor 124 and the source of the transistor 122. The source of the transistor 124 is shown coupled to the current source 126. Similarly, the gate of the transistor 110 is shown coupled to the drain of the transistor 130 and the source of the transistor 128. The source of the transistor 130 is shown coupled to the current source 132. The source of each of the transistors 110 and 118 is shown coupled to ground and the drain of the transistor 118 is shown coupled to the bit line 134 for driving the same and the drain of the transistor 110 is shown coupled to the bit line 144 for driving the same. The gates of each of the transistors 116 and 112 are shown coupled to each other and the gates of the transistors 108 and 120 are shown coupled to each other. The source of the transistor 116 and the source of the transistor 108 are each shown coupled to the voltage level, Vdd, well known in the art. The source of the transistors 112 and 120 are shown coupled to each other.

The gates of the transistors 114, 106, 152, and 110 are shown coupled to each other. The source of the transistors 112 and 120 are coupled to each other and to Vdd.

Due to each memory cell of the array 60 including two access transistors, two sense amplifiers are utilized in the circuit 99. Thus, the sense amplifier 102 senses the bit line 136 and the bit line 142 and the sense amplifier 104 senses the bit lines 134 and 144. In a three-port configuration, such as that of the embodiment of FIG. 2, three sense amplifiers are required.

As the case of the embodiment of FIG. 1, each of the resistive elements of the array 60 is read or written to by accessing it through two different access transistors and two word lines. Accordingly, two different resistive elements that are coupled to the same bit lines can be read at the same time by using two different sense amplifiers.

An exemplary read operation is now discussed relative to the array 60. The upper resistive elements, such as the elements 76, 82, 88, or 92 is accessed by activating the word line 70, which in the current example is setting the word line 70 to a high state, or WLA1=high. The lower resistive element, elements 78, 90, 84, or 94 is accessed by activating the word line 73, which in the current example amount to setting the word line 73 to a high state, or WLB2=high. The rest of the word lines, such as the word lines 71 and 72, are grounded. The source lines 138 and 140 are grounded (the active and also the reference select lines). These cause the output of the inverter 74 to go high, which causes the p-channel pull ups (or transistors 112, 120, 116, and 108) to turn on. Current flows through these transistors and through the bit lines 134, 136, 142, and 144 and through the resistive elements 80, 86, 96, and 98. The sense amplifiers 102 and 104 each compare the voltage values of their respective inputs and switch accordingly. The size of the current sources 126 and 132 are the same in the embodiment of FIG. 3, accordingly, the size of the P (and N) channel devices on the reference side are slightly larger to increase the voltage on the reference side when both the active and reference resistive elements have the same resistance value. Now let us consider the case when the bottom resistive element is being written into while the upper resistive element is being read. If, for example, the resistive element, in the case where it is a MTJ is switching from a parallel state to an anti-parallel state when being programmed, then the bit line 134 is at a high state, e.g. 1.2V and the source line 138 is at 0V, while the word line 72, WLA2, is high. Since the voltage of the source line 138 is at zero, the P-channels current sources are on and the top MTJ is fed through the bit line 136, while the word line 71, WLB1, is high and all other word lines are at ground. In this scheme the voltage appearing at the sense amp A, sense amplifier 102, determines the status of upper MTJ, such as the element 80 or 96. Now if we are converting the status of the lower MTJ, or the element 86 or 98, from anti-parallel (AP) to parallel (P), then the bit line 134 is at zero volts (BL1=0 V) and the source line 138 is at 1.2V. In this configuration the p-channels in the current sources are off and n-channels are on. On the upper MTJ current will go through the MTJ and is controlled by the N-channel current source. The voltages appear at two ends of the sense amp will indicate the status of the MTJ.

To read the state of the MTJ by sense amp A, sense amplifier 102, the power line is powered up, while the word line 70, WLA1, is high and the rest of the word lines are grounded. The current I pass through the MTJ and the voltage is compared to the voltage of the reference current resulting in 0 or 1 depending on the value of the MTJ resistance. Same MTJ can also be read by powering up the word line WLB1 and grounding the rest of the word lines. MTJ programming can easily be done by selecting the MTJ by either word or bit lines and passing proper current through it. One can reverse the direction of the current and change the resistance value of the selected MTJ.

As can be appreciated, multi-port MRAM is realized, in accordance with various embodiments and methods of the invention, by increasing the number of select transistors, word lines, bit lines and sense amplifiers.

Figure 4:
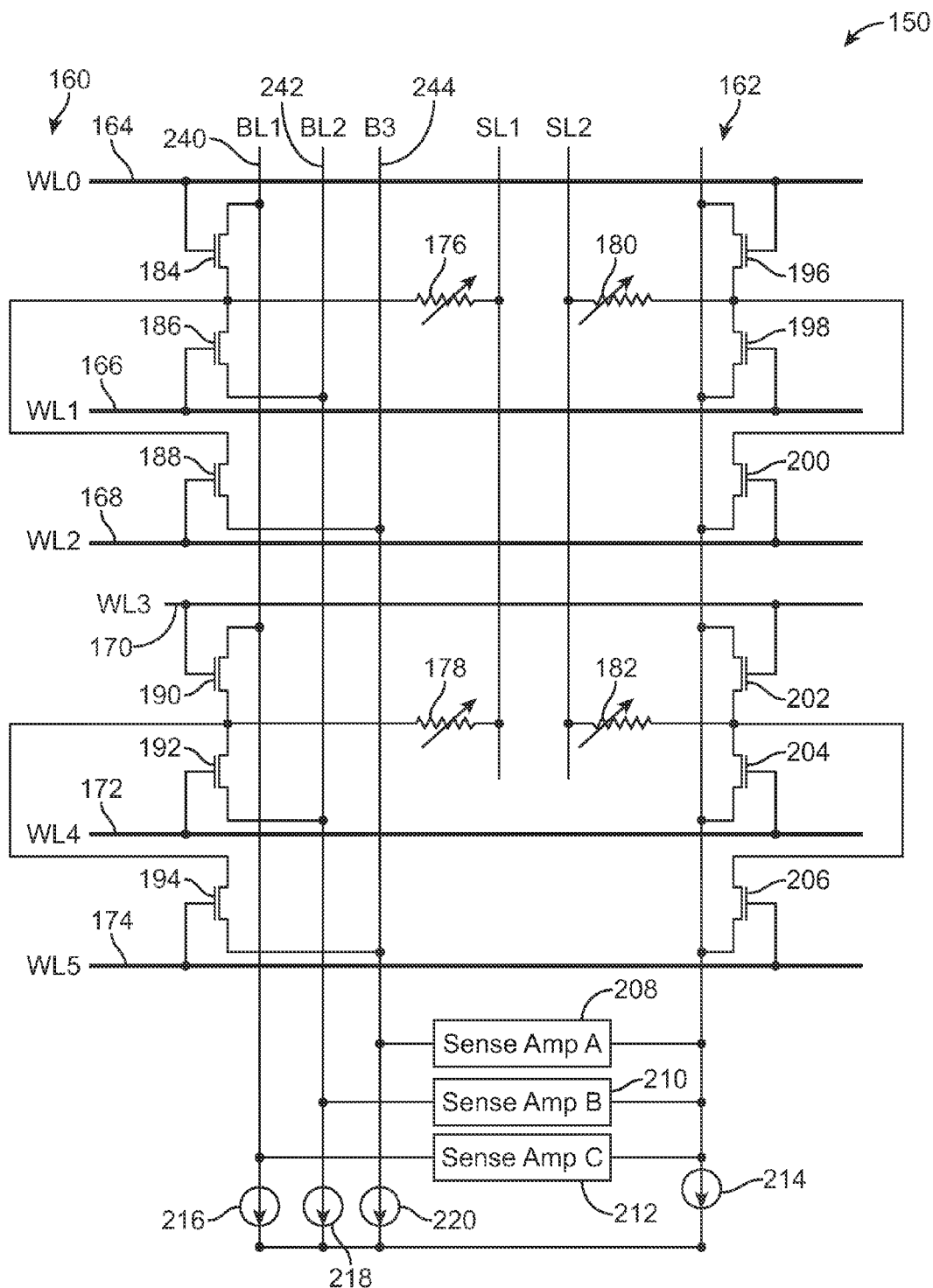
FIG. 4 shows a memory array 150, in accordance with another embodiment of the invention.

FIG. 4 shows a memory array 150, in accordance with another embodiment of the invention. The array 150 includes three-port resistive elements, analogous to that of the embodiment of FIG. 2. In accordance therewith, several MTJs are sensed substantially at the same time.

In FIG. 4, the array is shown to include MTJs 176 and 178 that are generally located on the left side of FIG. 2, at 160, and reference MTJs 180 and 182, generally located at the right side of FIG. 4, at 162. Further shown as a part of the array 150, are access lines, such as word lines 164-174 (also known as "WL0" through "WL5"). Further, the array 150 is shown to include access transistors 184-194, which are shown coupled to the MTJs 176 and 178 and access transistors 196-206, which are shown coupled to the reference MTJs 180 and 182. The array 150 is also shown to include sense amplifiers 208-212 and current sources 216-220.

The access lines on the left side of FIG. 4, at 160, such as the WL0 through WL 5, couple the each of the two MTJs to a distinct one of the sense amplifiers 208-212, i.e. the sense amplifiers A through C. Further details of the coupling of various elements or structures with each other, shown in FIG. 4, are not discussed because they are analogous to that of embodiments of prior figures. That is, the MTJs 176-178 are accessed through the different word lines WL0-WL5. The reference MTJs 180-182 on the right side of FIG. 4, serve as references when reading from and writing to the MTJs 176-78 but advantageously, only one reference voltage is required to read all the MTJs. The right side of all of the sense amplifiers 208-212 use the same voltage as those required by the reference MTJs 180-182 to sense the MTJs 176-178 when being read. The difference between two-port resistive elements, such as the embodiment 10, vs. three-port resistive elements, such as the embodiment 50 or 150, is that a dual-port MTJ can be accesses by two different routes, while in a triple-port MTJ arrangement, the same MTJ can be accessed via 3 different routes. In the embodiment of FIG. 4, three sense amplifiers can sense 3 different MTJs at the same time but they are compared to the same reference voltage, i.e. the reference voltage of the MTJs 180-182, appearing on the right side of the FIG. 4.

It is understood that while two MTJs 176 and 178 are shown in the embodiment of FIG. 4, additional MTJs may be employed requiring additional reference MTJs. The operation of the array 150 is analogous to that of embodiments discussed herein relative to prior figures.

Although the invention has been described in terms of specific embodiment, it is anticipated that alterations and modifications thereof will no doubt become apparent to those more skilled in the art. It is therefore intended that the following claims be interpreted as covering all such alterations and modification as fall within the true spirit and scope of the invention.

What is claimed is:

1. A memory array organized into rows and columns of resistive elements, the memory array comprising:
   a resistive element to be read or to be written thereto;
   a first access transistor coupled to the resistive element, to a first source line, and to a first word line; and
   a second access transistor coupled to the resistive element, a second source line, and to a second word line, the resistive element being coupled at one end to the first and second access transistors and at an opposite end to a bit line;
   wherein the resistive element is read through the first word line and the second word line at substantially the same time.

2. The memory array of claim 1, wherein the resistive element is written to while one or more other resistive elements, coupled to another bit line, are read.

3. The memory array, as recited in claim 1, wherein the resistive element is a magnetic random access memory (MRAM).

4. The memory array, as recited in claim 1, wherein the resistive element is a magnetic tunnel junction (MTJ).

5. The memory array, as recited in claim 1, wherein the first and second access transistors each have a gate and the gate of each of the first and second access transistors is coupled to a distinct word line.

6. The memory array, as recited in claim 1, wherein at least some of the other resistive elements of the memory array is coupled to a pair of first and second access transistors with each of the first access transistors of each of the pairs being coupled to first sense line and each of the second access transistors of each of the pairs being coupled to second sense line.

7. The memory array, as recited in claim 1, wherein each of the first and second access transistors of the pair has a gate that is coupled to a distinct word line.

8. The memory array, as recited in claim 1, further including a third access transistor coupled to the resistive element and to the second sense line, the third access transistor having a gate that is coupled to a word line that is distinct from the word lines to which the first and second access transistors are coupled.

9. The memory array, as recited in claim 1, wherein the resistive element is read while one or more other resistive elements coupled to another bit line are written thereto.

10. A method of reading from and writing to resistive elements of a memory array organized into rows and columns of resistive elements, the method comprising:
    accessing a first resistive element through at least a first access transistor, the first access transistor coupled to the resistive element, a first source line, and a first word line, a second access transistor coupled to the resistive element, a second source line, and a second word line, the resistive element being coupled at one end to the first and second access transistors and at an opposite end to a bit line; and
    reading the resistive element through the first word line and the second word line at substantially the same time.

* * * * *